US012119574B2

United States Patent
Agawa (10) Patent No.: US 12,119,574 B2
(45) Date of Patent: Oct. 15, 2024

(54) WIRING DEVICE HAVING A PLURALITY OF PROTRUSIONS

(71) Applicants: Kabushiki Kaisha Toshiba, Tokyo (JP); Toshiba Electronic Devices & Storage Corporation, Tokyo (JP)

(72) Inventor: Kenichi Agawa, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 297 days.

(21) Appl. No.: 17/689,759

(22) Filed: Mar. 8, 2022

(65) Prior Publication Data

US 2022/0302615 A1 Sep. 22, 2022

(30) Foreign Application Priority Data

Mar. 22, 2021 (JP) ................................. 2021-047618

(51) Int. Cl.
*H01R 12/53* (2011.01)
*H01R 12/88* (2011.01)
*H05K 1/14* (2006.01)

(52) U.S. Cl.
CPC ............. *H01R 12/53* (2013.01); *H05K 1/144* (2013.01); *H05K 2201/042* (2013.01); *H05K 2201/10287* (2013.01); *H05K 2201/10393* (2013.01)

(58) Field of Classification Search
CPC ........ H01R 12/53; H01R 12/88; H01R 12/79; H01R 12/598; H01R 4/16; H05K 1/44
See application file for complete search history.

(56) References Cited

U.S. PATENT DOCUMENTS 5,780,774 A 7/1998 Ichikawa
6,332,801 B1 * 12/2001 Watanbe .............. H01R 4/2433
439/495

(Continued)

FOREIGN PATENT DOCUMENTS

CN 103180941 A 6/2013
CN 105144370 A 12/2015

(Continued)

OTHER PUBLICATIONS

First Office Action issued in Chinese Patent Application No. 202210127030.3, dated Jul. 12, 2024 in 10 pages.

*Primary Examiner* — Hae Moon Hyeon
(74) *Attorney, Agent, or Firm* — Knobbe, Martens, Olson & Bear, LLP (57) ABSTRACT

A wiring device has a plate having a first surface and a second surface and a first protrusion having a side surface capable of locking a first substrate and a first upper surface with a plurality of first grooves and the first substrate including a terminal on a surface of the first substrate. Each of the first grooves accommodates a coating of a wiring including a conductor and the coating, the first protrusion extending in a third direction. The holder includes a plurality of connection portions, and the holder includes a plurality of second grooves, each of the second grooves capable of accommodating the conductor exposed from the coating. The cover is rotatably openable and closable with respect to the plate, and the cover brings the conductor into pressure contact with the terminal between the first protrusion and the holder.

10 Claims, 7 Drawing Sheets

(56) References Cited

U.S. PATENT DOCUMENTS

| | | | |
|---|---|---|---|
| 7,520,774 B2* | 4/2009 | Watanabe | H01R 13/65918 |
| | | | 439/495 |
| 8,267,717 B2* | 9/2012 | Ishishita | H01R 12/88 |
| | | | 439/495 |
| 8,784,119 B2* | 7/2014 | Tseng | H01R 12/61 |
| | | | 439/495 |
| 2005/0106903 A1 | 5/2005 | Tamagawa et al. | |
| 2005/0106932 A1* | 5/2005 | Miyazawa | H01R 13/26 |
| | | | 439/495 |
| 2006/0252301 A1* | 11/2006 | Matsuoka | H01R 12/772 |
| | | | 439/495 |
| 2008/0242139 A1* | 10/2008 | Matsuoka | H01R 12/57 |
| | | | 439/271 |
| 2009/0215309 A1* | 8/2009 | Mongold | H01R 12/592 |
| | | | 439/495 |
| 2014/0000940 A1 | 1/2014 | Onitsuka et al. | |
| 2016/0104650 A1 | 4/2016 | Tsujino et al. | |

FOREIGN PATENT DOCUMENTS

| | | |
|---|---|---|
| DE | 102013011297 A | 1/2015 |
| JP | S53-034537 Y2 | 8/1978 |
| JP | S58-170883 U | 11/1983 |
| JP | S62-040532 Y2 | 10/1987 |
| JP | S63-041739 Y2 | 11/1988 |
| JP | H05-159827 A | 6/1993 |
| JP | H08-116477 A | 5/1996 |
| JP | H08-330003 A | 12/1996 |
| JP | H09-102340 A | 4/1997 |
| JP | 3059690 U | 7/1999 |
| JP | 2995966 B2 | 12/1999 |
| JP | 2000-133376 A | 5/2000 |
| JP | 2001-060469 A | 3/2001 |
| JP | 2002-025656 A | 1/2002 |
| JP | 2005-050794 A | 2/2005 |
| JP | 2010-279227 A | 12/2010 |
| JP | 2013-164965 A | 8/2013 |
| JP | 2021-044056 A | 3/2021 |

* cited by examiner

WIRING DEVICE HAVING A PLURALITY OF PROTRUSIONS

CROSS-REFERENCE TO RELATED APPLICATION

This application is based upon and claims the benefit of priority from Japanese Patent Application No. 2021-047618, filed on Mar. 22, 2021, the entire contents of which are incorporated herein by reference.

FIELD

Embodiments described herein relate generally to a wiring device.

BACKGROUND

For example, a joining material such as solder is used for connecting a wiring to a substrate such as a printed substrate. However, connection using a joining material may not necessarily be easy. In this case, connection using a wiring device is performed.

DETAILED DESCRIPTION

A wiring device of an embodiment includes: a plate having a first surface and a second surface provided above the first surface; a first protrusion provided on the second surface, the first protrusion having a side surface capable of locking a first substrate and a first upper surface including a plurality of first grooves provided parallel to a first direction, the first substrate being insertable in the first direction parallel to the second surface and being removable in a second direction opposite the first direction on the second surface and the first substrate including a terminal on a surface of the first substrate, each of the first grooves capable of accommodating a coating of a wiring including a conductor and the coating provided around the conductor, the first protrusion extending in a third direction intersecting the first direction and the second direction and the third direction being parallel to the second surface; a holder provided on the second surface, the holder including a plurality of connection portions straddling the first substrate inserted, the holder being connected to the second surface to interpose the first substrate, and the holder including a second upper surface including a plurality of second grooves provided parallel to the first direction, each of the second grooves capable of accommodating the conductor exposed from the coating; and a cover provided on the second surface, the cover including a support portion to support the cover so as to be rotatably openable and closable with respect to the plate, and the cover including a second protrusion capable of bringing the conductor into pressure contact with the terminal between the first protrusion and the holder, the conductor being exposed.

Hereinafter, embodiments will be described with reference to the drawings. Incidentally, in the following description, the same members and the like are denoted by the same reference signs, and a description of members and the like once described will be appropriately omitted.

In the specification, in order to indicate a positional relationship between components and the like, an up direction of the drawings is described as the "up", and a down direction of the drawings is described as the "down". In the specification, the concepts of the "up" and the "down" are not necessarily terms indicating a relationship with a direction of gravity.

First Embodiment

A wiring device of the present embodiment includes: a plate having a first surface and a second surface provided above the first surface; a first protrusion provided on the second surface, the first protrusion having a side surface capable of locking a first substrate and a first upper surface including a plurality of first grooves provided parallel to a first direction, the first substrate being insertable in the first direction parallel to the second surface and being removable in a second direction opposite the first direction on the second surface and the first substrate including a terminal on a surface of the first substrate, each of the first grooves capable of accommodating a coating of a wiring including a conductor and the coating provided around the conductor, the first protrusion extending in a third direction intersecting the first direction and the second direction and the third direction being parallel to the second surface; a holder provided on the second surface, the holder including a plurality of connection portions straddling the first substrate inserted, the holder being connected to the second surface to interpose the first substrate, and the holder including a second upper surface including a plurality of second grooves provided parallel to the first direction, each of the second grooves capable of accommodating the conductor exposed from the coating; and a cover provided on the second surface, the cover including a support portion to support the cover so as to be rotatably openable and closable with respect to the plate, and the cover including a second protrusion capable of bringing the conductor into pressure contact with the terminal between the first protrusion and the holder, the conductor being exposed.

Figure 1:
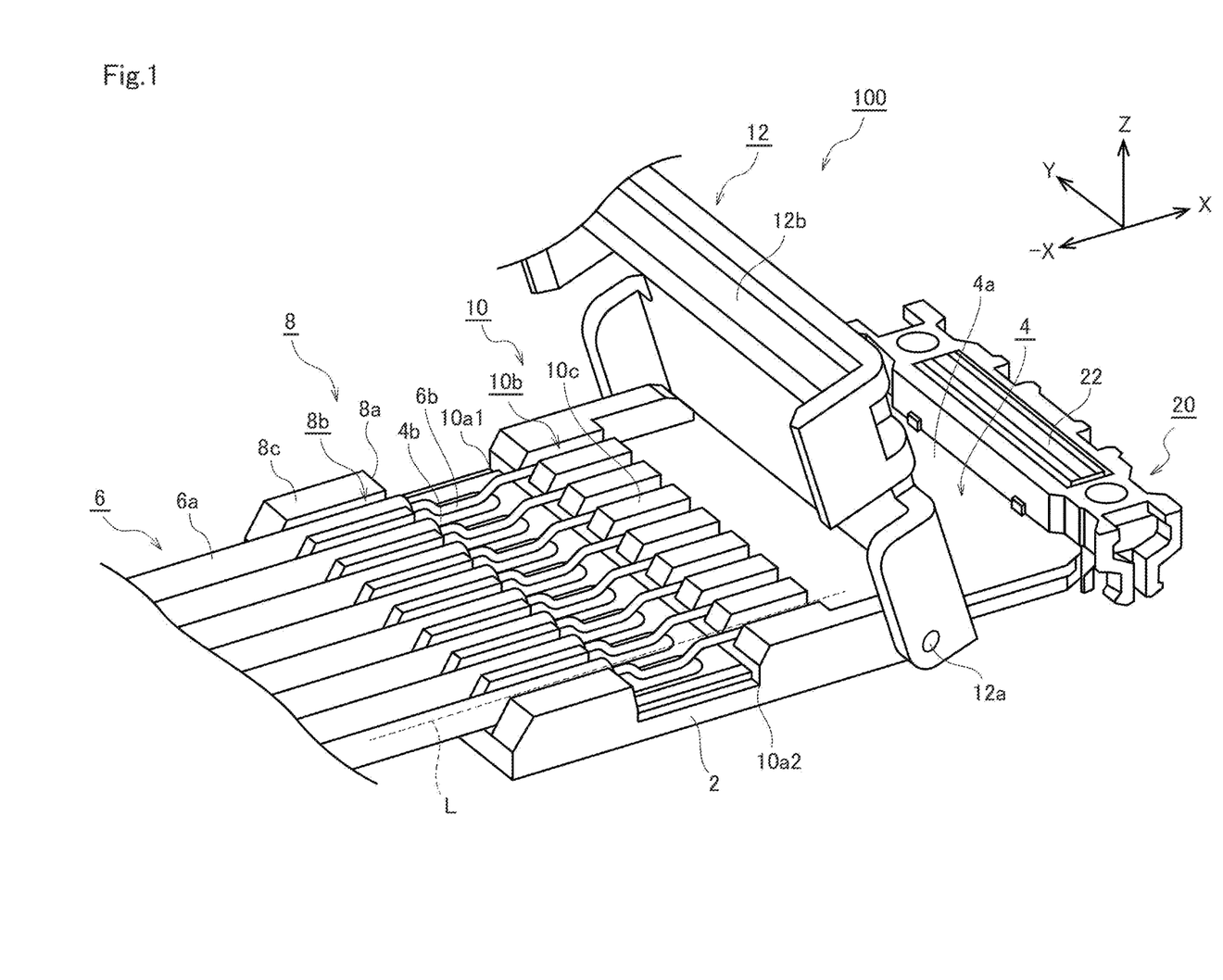
FIG. 1 is a schematic perspective view of a wiring device of a first embodiment.
Figure 2:
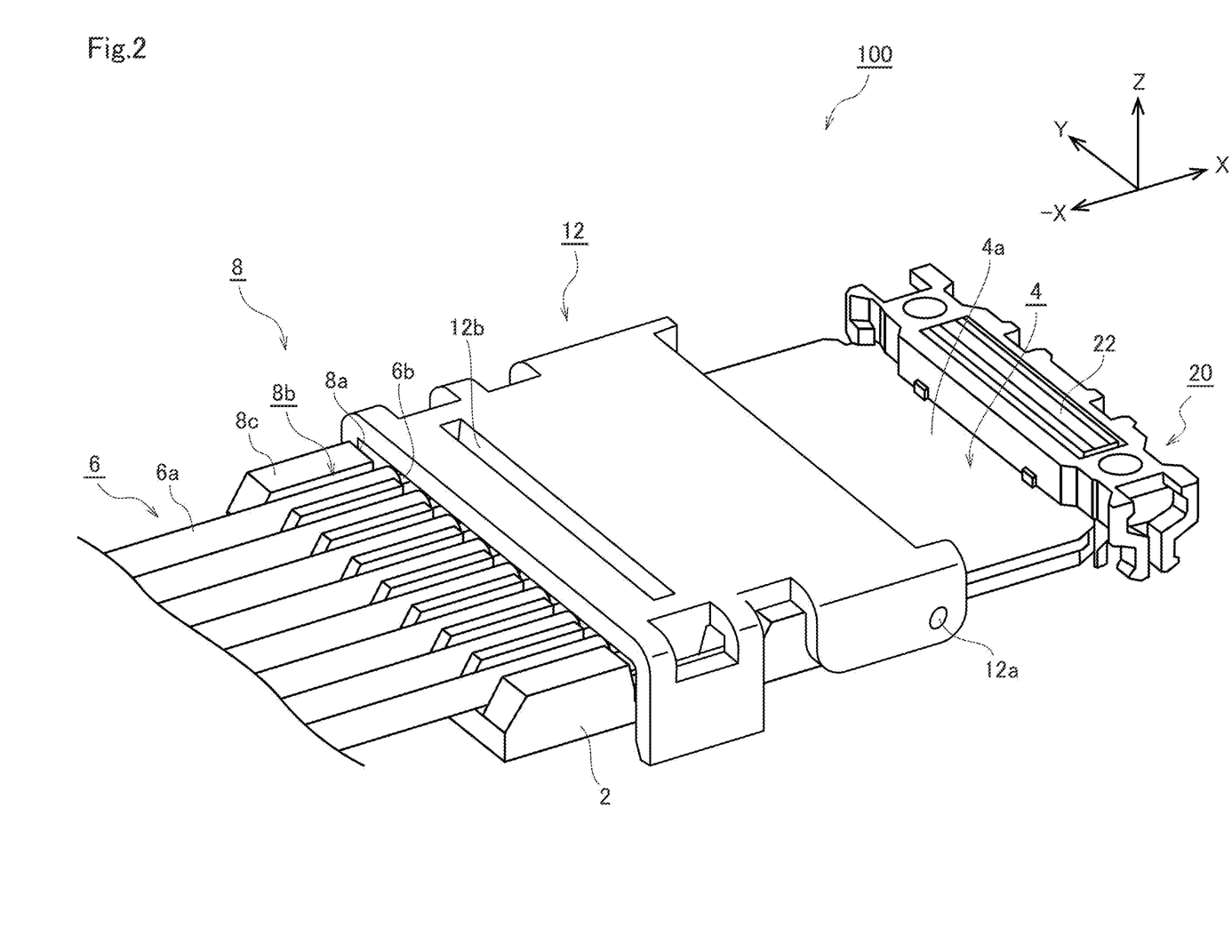
FIG. 2 is a schematic perspective view of the wiring device of the first embodiment.
Figure 3A:
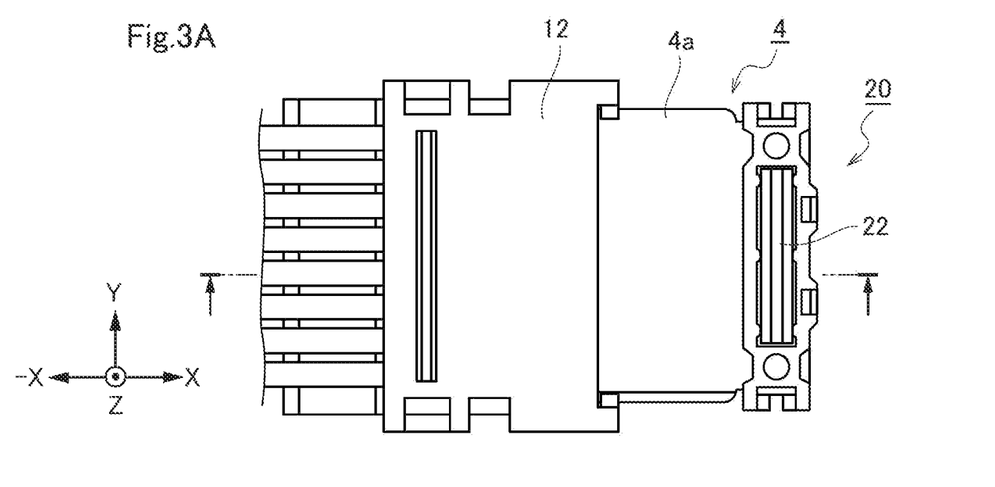
FIGS. 3A to 3C are schematic views of principal parts of the wiring device of the first embodiment.
Figure 3B:
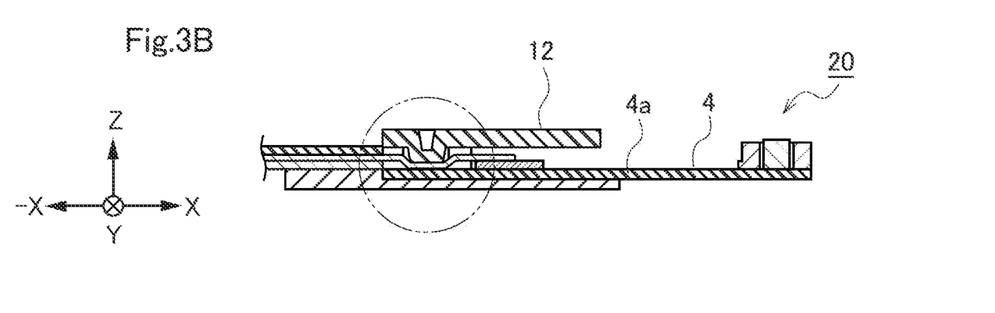
Figure 3C:
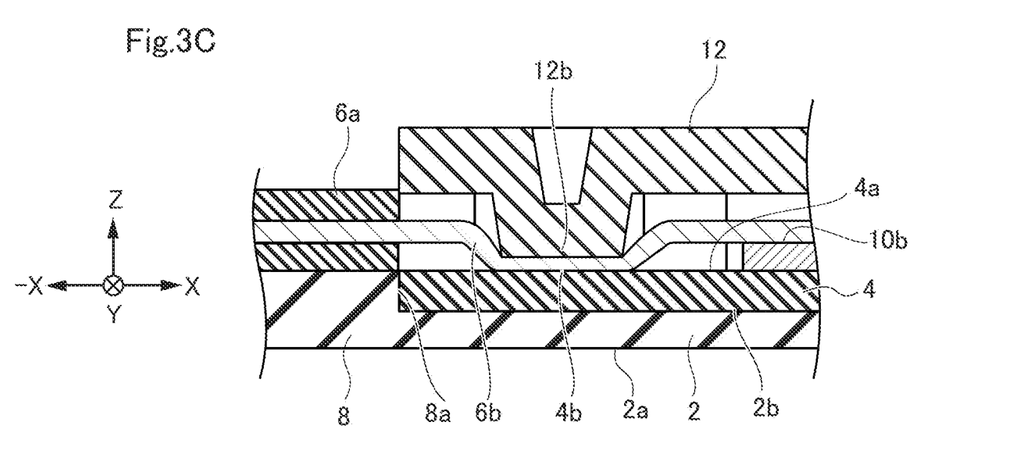

FIG. 1 is a schematic perspective view of a wiring device 100 of the present embodiment. FIG. 2 is a schematic perspective view of the wiring device 100 of the present embodiment. FIGS. 3A to 3C are schematic views of principal parts of the wiring device 100 of the present embodiment.

The wiring device 100 includes a plate 2, a first protrusion 8, a first member (an example of a holder or a supporter) 10, and a second member (an example of a cover or a covering) 12.

The second member 12 is supported by a support portion 12a so as to be rotatably openable and closable with respect to the plate 2. FIG. 1 is a schematic perspective view of the wiring device 100 in a state where the second member 12 is opened. FIG. 2 is a schematic perspective view of the wiring device 100 in a state where the second member 12 is closed. FIG. 3A is a schematic top view of the wiring device 100 in a state where the second member 12 is closed. FIG. 3B is a schematic cross-sectional view of the wiring device 100 in a state where the second member 12 is closed. FIG. 3C is a schematic cross-sectional view of the principal parts of the wiring device 100 in a state where the second member 12 is closed.

Here, an X direction, a Y direction that perpendicularly intersects the X direction, and a Z direction that perpendicularly intersects the X direction and the Y direction are defined. The X direction is one example of a second direction, a −X direction is one example of a first direction, and the Y direction is one example of a third direction.

The plate 2 has a first surface 2a and a second surface 2b provided above the first surface 2a. In other words, the plate 2 has the first surface 2a and the second surface 2b provided opposite the first surface 2a. The first surface 2a and the second surface 2b are disposed parallel to, for example, an XY plane.

The first protrusion 8 is provided on the second surface 2b of the plate 2. The first protrusion 8 has a side surface 8a and a first upper surface 8c. The first protrusion 8 extends in the Y direction.

A first substrate 4 is insertable in the −X direction and is removable in the X direction on the second surface 2b. The first substrate 4 inserted in the −X direction can be locked by the side surface 8a provided on an X direction side of the first protrusion 8.

A plurality of terminals 4b are formed on a surface 4a of the first substrate 4. The wiring device 100 of the present embodiment is a device that connects the terminals 4b of the first substrate 4 to wirings 6 to be described later. Here, the first substrate 4 is, for example, a printed substrate, but is not limited thereto.

Figure 4:
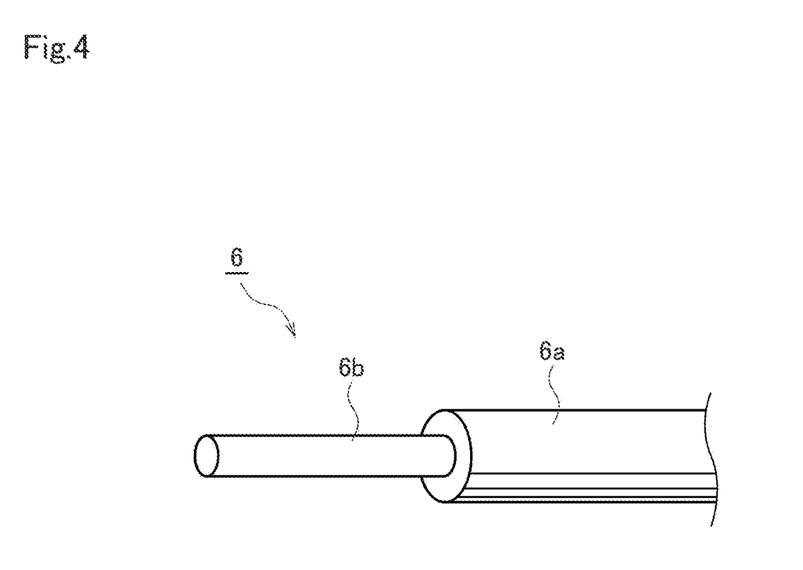
FIG. 4 is a schematic perspective view of a wiring of the first embodiment.

FIG. 4 is a schematic view of the wiring 6 of the present embodiment. The wiring 6 includes a conductor 6b and a coating 6a provided around the conductor 6b. Incidentally, a mode of the wiring 6 used in the wiring device 100 of the present embodiment is not limited to the mode illustrated in FIG. 4.

The first upper surface 8c includes a plurality of first grooves 8b provided parallel to the X direction (−X direction). A plurality of the wirings 6 are introduced from a −X direction side to the X direction side. Each of the first grooves 8b is capable of accommodating the coating 6a of the wiring 6.

The first member 10 is provided on the second surface 2b of the plate 2. The first member 10 includes a plurality of connection portions 10$a_1$, 10$a_2$ and a second upper surface 10c. For example, as illustrated in FIGS. 1 and 3C, the first member 10 is provided to straddle the first substrate 4 that is inserted, in the Y direction. Then, the first member 10 is connected to the second surface 2b at a connection portion 10$a_1$ and a connection portion 10$a_2$ as the connection portions 10a to interpose the first substrate 4 that is inserted, in the Y direction.

The second upper surface 10c includes a plurality of second grooves 10b provided parallel to the X direction. Each of the second grooves 10b is capable of accommodating the conductor 6b exposed from the coating 6a.

It is preferable that the same imaginary straight line L passes through each of the first grooves 8b and through each of the second grooves 10b.

As described above, the second member 12 is supported by the support portion 12a so as to be rotatably openable and closable with respect to the plate 2. The second member 12 includes a second protrusion 12b. Then, for example, as illustrated in FIG. 3C, a plurality of the conductors 6b can be in pressure contact with the terminals 4b in a state where the second member 12 is closed.

Incidentally, it is preferable that the conductors 6b are bent toward the first substrate 4 and are brought into pressure contact with the terminals 4b by the second protrusion 12b.

It is preferable that the support portion 12a is provided such that the first member 10 is provided between the support portion 12a and the terminals 4b on the first substrate 4 which is inserted. However, a location where the support portion 12a is provided on the plate 2 is not particularly limited.

A connector 20 is provided, for example, at an end portion on the X direction side of the first substrate 4. Connector wirings 22 are provided inside the connector 20. The connector wirings 22 are connected to the terminals 4b by wirings (not illustrated). Another connector (not illustrated) is connected to the connector 20. Then, such a connector (not illustrated) is connected to another substrate (not illustrated). In such a manner, the wirings 6 are connected to wirings on the another substrate (not illustrated).

The plate 2, the first protrusion 8, and the first member 10 are formed from, for example, a material containing epoxy resin, a material containing epoxy resin containing glass fibers, a material containing silicone rubber, or the like. However, the material contained in the plate 2, the first protrusion 8, and the first member 10 is not limited to these materials.

Figure 5:
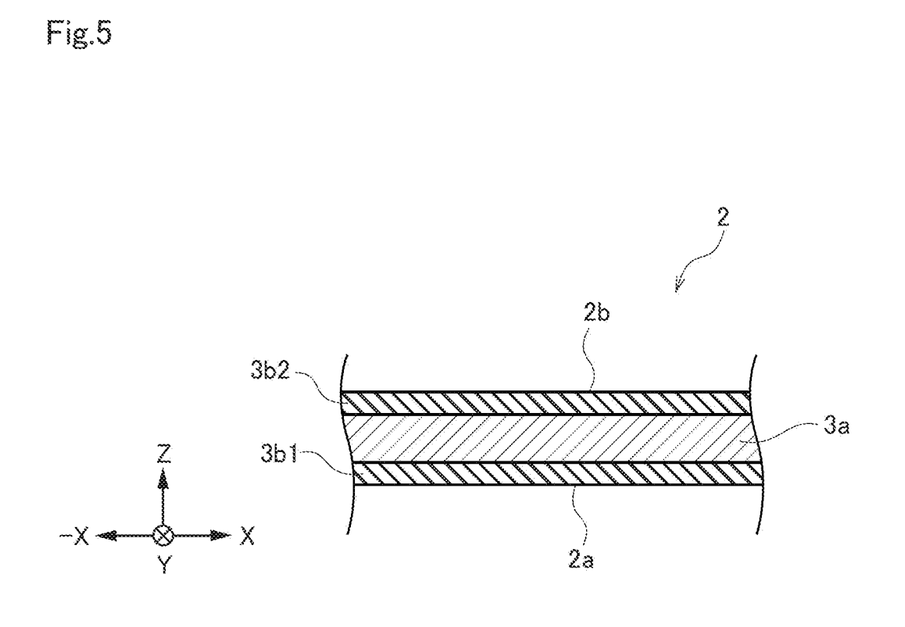
FIG. 5 is a schematic cross-sectional view of a plate of the first embodiment.

Regarding the material contained in the plate 2, the first protrusion 8, and the first member 10, the plate 2 will be described with reference to FIG. 5 as an example. The plate 2 is preferably formed from a material including a metal member 3a, and an insulating member 3$b_1$ and an insulating member 3$b_2$ that are provided on a surface of the metal member 3a. In FIG. 5, the insulating member 3$b_1$ is provided on a first surface 2a side, and the insulating member 3$b_2$ is provided on a second surface 2b side. Here, the metal member 3a contains a metal such as copper (Cu), aluminum (Al), silver (Ag), gold (Au), iron (Fe), cobalt (Co), or nickel (Ni), but is not particularly limited to containing these metals. In addition, the insulating member 3$b_1$ and the insulating member 3$b_2$ are, for example, a fluororesin such as polytetrafluoroethylene or polychlorotrifluoroethylene, but is not particularly limited to being these materials. Incidentally, the material contained in the first protrusion 8 and the first member 10 can also be the same as that contained in the plate 2.

For example, the plate 2, the first protrusion 8, and the first member 10 are integrally formed. However, the plate 2, the first protrusion 8, and the first member 10 may be separately formed and then joined together.

Figure 6A:
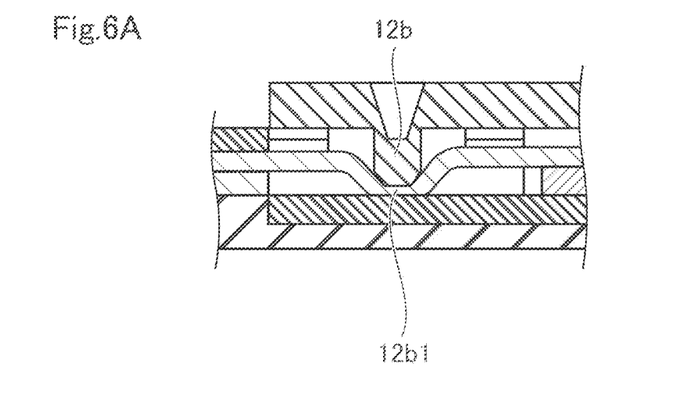
FIGS. 6A to 6C are schematic cross-sectional views of other examples of the principal parts of the wiring device of the first embodiment.
Figure 6B:
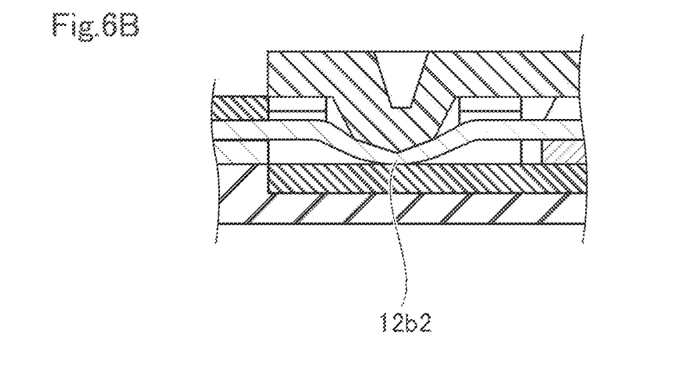
Figure 6C:
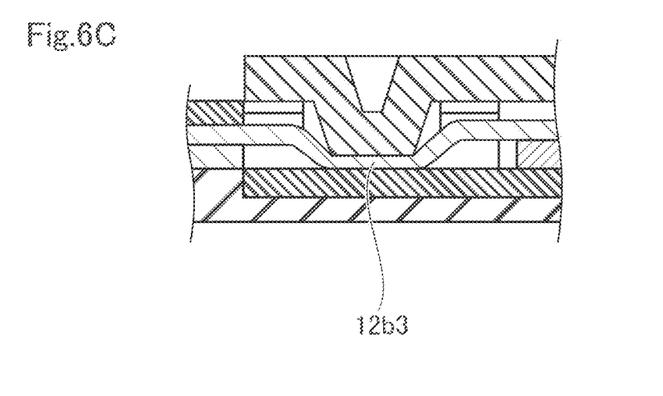

FIGS. 6A to 6C are schematic cross-sectional views of other examples of the principal parts of the wiring device 100 of the present embodiment. FIGS. 6A to 6C illustrate other examples of the second protrusion 12b. The second protrusion 12b in FIG. 6A includes a third protrusion 12$b_1$ that is provided on the second protrusion 12b (upper surface of the second protrusion 12b) and that is smaller than the second protrusion 12b. The second protrusion 12b in FIG. 6B includes a curved surface portion 12$b_2$ on the second protrusion 12b (upper surface of the second protrusion 12b). The second protrusion 12b in FIG. 6C has a flat surface 12$b_3$ that can be disposed on the second protrusion 12b (upper surface of the second protrusion 12b) so as to be parallel to the surface 4a of the first substrate 4.

Next, functions and effects of the wiring device 100 of the present embodiment will be described.

A case is considered in which the wirings 6 are connected to the terminals 4b provided on the surface 4a of the first substrate 4. Good electrical connection between the terminals 4b and the wirings 6 can be obtained, for example, by using a joining material such as solder. However, it does not mean that everyone can perform soldering work to obtain such electrical connection. Further, especially when an interval between the terminals 4b is narrow to reduce the size, precise soldering work is required, so that it becomes increasingly difficult for everyone to perform such soldering work. In addition, since the wirings 6 are easily twisted, it is not easy to dispose the wirings 6 on the terminals 4b.

As a method for obtaining such electrical connection without performing soldering work, for example, a method can be considered in which through-holes are provided in the first substrate 4, a metal material is disposed on inner walls of such the through-holes, and the wirings 6 are wound through the through-holes to make electrical connection with the metal material. However, especially when a diameter of the through-hole is small, it is difficult to perform work such as passing the wiring 6 through the through-hole. For this reason, it is difficult to obtain good electrical connection between the terminals 4b and the wirings 6 without performing soldering work, which is a problem.

Therefore, the wiring device 100 of the present embodiment includes: a plate having a first surface and a second surface provided above the first surface; a first protrusion provided on the second surface, having a side surface capable of locking a first substrate and a first upper surface including a plurality of first grooves provided parallel to a first direction, the first substrate being insertable in the first direction parallel to the second surface and being removable in a second direction opposite the first direction on the second surface and including a terminal on a surface of the first substrate, each of the first grooves capable of accommodating a coating of a wiring including a conductor and the coating provided around the conductor, and extending in a third direction intersecting the first direction and the second direction and being parallel to the second surface; a first member provided on the second surface, and including a plurality of connection portions straddling the first substrate inserted and being connected to the second surface to interpose the first substrate, and a second upper surface including a plurality of second grooves provided parallel to the first direction, each of the second grooves capable of accommodating the conductor exposed from the coating; and a second member provided on the second surface, including a support portion to support the second member so as to be rotatably openable and closable with respect to the plate, and including a second protrusion capable of bringing the conductor into pressure contact with the terminal between the first protrusion and the first member, the conductor being exposed.

According to the wiring device 100 of the present embodiment, the first grooves 8b provided in the first upper surface 8c of the first protrusion 8 are capable of accommodating the coatings 6a of the wirings 6. In addition, the second grooves 10b provided in the second upper surface 10c of the first member 10 are capable of accommodating the conductors 6b exposed from the coatings 6a. Since such accommodation can be performed, the twisting of the wirings 6 and a short circuit between the conductors 6b are unlikely to occur.

Then, the second protrusion 12b is capable of bringing the conductors 6b into pressure contact with the terminals 4b at one time. Accordingly, good electrical connection between the conductors 6b and the terminals 4b can be obtained. In addition, even when the plurality of wirings 6 have to be worked on, high workability can be maintained. Further, force can be uniformly applied to each of the conductors 6b by using the second protrusion 12b. For this reason, a variation in the degree of electrical connection between the conductor 6b and the terminal 4b is reduced.

The conductors 6b are bent toward the first substrate 4 by the second protrusion 12b. Because of the bending, the connection strength is increased, and the wirings 6 are unlikely to come off from the wiring device 100.

It is preferable that the first protrusion 8, the first member 10, or the second member 12 includes a metal member and an insulating member provided on a surface of the metal member. For example, when silicone rubber is used, expansion and contraction caused by an increase and decrease in temperature is large, so that a state of connection between the conductors 6b and the terminals 4b is likely to change. In addition, silicone rubber has a relatively large deterioration. On the other hand, when a metal member and an insulating member are used, expansion and contraction caused by an increase and decrease in temperature is small, so that a state of connection between the conductors 6b and the terminals 4b is unlikely to change. Further, when a metal member and an insulating member are used, deterioration is unlikely to occur.

Good contact between the conductors 6b and the terminals 4b can be obtained by any one of the configuration where the third protrusion $12b_1$ is provided that is provided on the second protrusion 12b (upper surface of the second protrusion 12b) and that is smaller than the second protrusion 12b, the configuration where the curved surface portion $12b_2$ is provided on the surface, and the configuration where the flat surface $12b_3$ is provided that can be disposed parallel to the surface 4a of the first substrate 4.

It is preferable that the support portion 12a is provided such that the first member 10 is provided between the support portion 12a and the terminals 4b of the first substrate 4 which is inserted. A rotatably openable and closable portion of the second member 12 is disposed as close to the X direction side as possible. Then, the wiring 6 (conductor 6b) can be easily inserted into the first groove 8b and into the second groove 10b from the −X direction side.

It is preferable that the same imaginary straight line L passes through each of the first grooves 8b and through each of the second grooves 10b. When the same imaginary straight line L does not pass therethrough, for example, the coating 6a and the conductor 6b are accommodated in the first groove 8b and in the second groove 10b in a state where the coating 6a and the conductor 6b are shifted in the Y direction. In this case, it is difficult to easily determine whether or not the coating 6a and the conductor 6b of the same wiring 6 are accommodated in the first groove 8b and in the second groove 10b. In addition, when the same imaginary straight line L passes therethrough, the wiring 6 can be easily accommodated therein.

According to the wiring device 100 of the present embodiment, a wiring device capable of easily connecting wirings can be provided.

Second Embodiment

A wiring device of the present embodiment is different from the wiring device of the first embodiment in that the wiring device further includes a second substrate provided above the first substrate to have a length in the first direction shorter than a length of the first substrate, and a third substrate provided above the second substrate to have a length in the first direction shorter than the length of the first substrate, a distance between the third substrate and the second substrate being shorter than a distance between the second substrate and the first substrate. Here, a description of contents overlapping with those of the first embodiment will be omitted.

Figure 7:
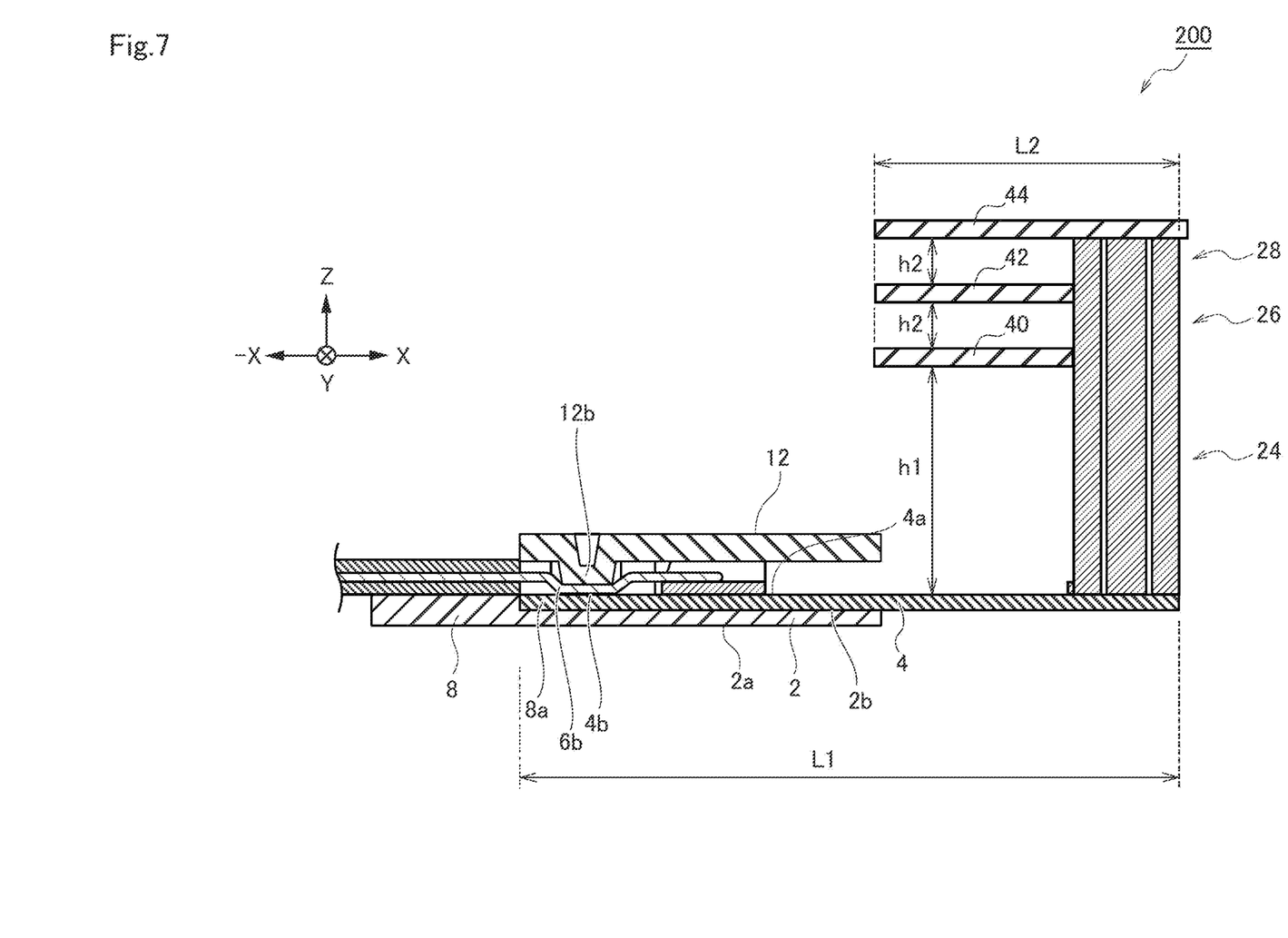
FIG. 7 is a schematic cross-sectional view of a wiring device of a second embodiment.

FIG. 7 is a schematic cross-sectional view of a wiring device 200 of the present embodiment. A connector 24 is provided on the first substrate 4. A second substrate 40 is provided on the connector 24 so as to be parallel to the XY plane. The connector 24 connects the first substrate 4 and the second substrate 40. A connector 26 is provided on the second substrate 40. A third substrate 42 is provided on the connector 26 so as to be parallel to the XY plane. The connector 26 connects the second substrate 40 and the third substrate 42. A connector 28 is provided on the third substrate 42. A fourth substrate 44 is provided on the connector 28 so as to be parallel to the XY plane. The connector 28 connects the third substrate 42 and the fourth substrate 44. Connector wirings (not illustrated) are provided inside the connector 24, the connector 26, and the connector 28. Then, wirings (not illustrated) provided on the first substrate 4, wirings (not illustrated) provided on the second substrate 40, wirings (not illustrated) provided on the third substrate 42, and wirings (not illustrated) provided on the fourth substrate 44 can be electrically connected to each other by such the connector wirings.

Then, when a length of the first substrate 4 in the X direction is $L_1$ and a length of the second substrate 40, of the third substrate 42, and of the fourth substrate 44 in the X direction is $L_2$, $L_1 > L_2$. Namely, the length of the second substrate 40, of the third substrate 42, and of the fourth substrate 44 in the X direction is shorter than the length of the first substrate 4 in the X direction.

In addition, when a distance between the first substrate 4 and the second substrate 40 in the Z direction is $h_1$, a distance between the second substrate 40 and the third substrate 42 in the Z direction is $h_2$, and a distance between the third substrate 42 and the fourth substrate 44 in the Z direction is $h_2$, $h_1 > h_2$. Namely, the distance between the second substrate 40 and the third substrate 42 in the Z direction and the distance between the third substrate 42 and the fourth substrate 44 in the Z direction is shorter than the distance between the first substrate 4 and the second substrate 40 in the Z direction.

The above mode is preferable since a space where the second member 12 is rotatably openable and closable is secured and many substrates are provided while the size of the wiring device 200 is reduced. For example, in the case of $L_2 > L_1$, the second member 12 collides with the second substrate 40, so that the second member 12 is not rotatably openable and closable. Therefore, $L_1 > L_2$ is set to facilitate an opening and closing operation of the second member 12. In addition, when $h_2 > h_1$ is set, the overall size of the wiring device 200 increases. Therefore, $h_1 > h_2$ is set to provide as many substrates as possible in a small region, so that the size of the wiring device 200 can be reduced.

Incidentally, the second substrate 40, the third substrate 42, and the fourth substrate 44 may not be equal to each other in length in the X direction. In addition, the distance between the second substrate 40 and the third substrate 42 in the Z direction and the distance between the third substrate 42 and the fourth substrate 44 in the Z direction may not be equal to each other.

According to the wiring device 200 of the present embodiment, a wiring device capable of easily connecting wirings can be provided.

While certain embodiments have been described, these embodiments have been presented by way of example only, and are not intended to limit the scope of the inventions. Indeed, a wiring device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A wiring device comprising:
a plate having a first surface and a second surface provided above the first surface;
a first protrusion provided on the second surface, the first protrusion having a side surface capable of locking a first substrate and a first upper surface including a plurality of first grooves provided parallel to a first direction, the first substrate being insertable in the first direction parallel to the second surface and being removable in a second direction opposite the first direction on the second surface and the first substrate including a terminal on a surface of the first substrate, each of the first grooves capable of accommodating a coating of a wiring including a conductor and the coating provided around the conductor, the first protrusion extending in a third direction intersecting the first direction and the second direction and the third direction being parallel to the second surface;
a holder provided on the second surface, the holder including a plurality of connection portions straddling the first substrate inserted, the holder being connected to the second surface to interpose the first substrate, and the holder including a second upper surface including a plurality of second grooves provided parallel to the first direction, each of the second grooves capable of accommodating the conductor exposed from the coating; and
a cover provided on the second surface, the cover including a support portion to support the cover so as to be rotatably openable and closable with respect to the plate, and the cover including a second protrusion capable of bringing the conductor into pressure contact with the terminal between the first protrusion and the holder, the conductor being exposed.

2. The wiring device according to claim 1,
wherein the conductor is bent toward the first substrate by the second protrusion.

3. The wiring device according to claim 1,
wherein the first protrusion, the holder, or the cover includes a metal member and an insulating member provided on a surface of the metal member.

4. The wiring device according to claim 3,
wherein the insulating member is a fluororesin.

5. The wiring device according to claim 1,
wherein the second protrusion includes a third protrusion provided on the second protrusion and being smaller than the second protrusion.

6. The wiring device according to claim 1,
wherein the second protrusion includes a curved surface portion.

7. The wiring device according to claim 1,
wherein the second protrusion has a flat surface capable of being disposed parallel to the surface of the first substrate.

8. The wiring device according to claim 1,
wherein the holder is provided between the support portion and the terminal of the first substrate inserted.

9. The wiring device according to claim 1,
wherein the same imaginary straight line passes through the first groove and through the second groove.

10. The wiring device according to claim 1, further comprising:
a second substrate provided above the first substrate and having a length in the first direction shorter than a length of the first substrate; and
a third substrate provided above the second substrate and having a length in the first direction shorter than the length of the first substrate, a distance between the third substrate and the second substrate being shorter than a distance between the second substrate and the first substrate.

* * * * *